United States Patent [19]

Tam et al.

[11] Patent Number: 5,326,426
[45] Date of Patent: Jul. 5, 1994

[54] UNDERCUT MEMBRANE MASK FOR HIGH ENERGY PHOTON PATTERNING

[76] Inventors: Andrew C. Tam, 12144 Via Roncole, Saratoga, Calif. 95070; Gerhard E. Wolbold, Waldstr. 38, Magstadt, Fed. Rep. of Germany D-7037; Werner Zapka, Ritterstr. 29, 7034, Gartringen, Fed. Rep. of Germany

[21] Appl. No.: 791,712

[22] Filed: Nov. 14, 1991

[51] Int. Cl.⁵ .................. H01L 21/306; B44C 1/22; C03C 15/00
[52] U.S. Cl. .................. 156/643; 156/628; 156/647; 156/651; 156/657; 156/659.1; 156/662; 156/644; 156/345; 428/137; 219/121.69; 219/121.85
[58] Field of Search ............. 156/628, 643, 647, 651, 156/653, 657, 659.1, 662, 345, 644; 430/5; 428/134, 137; 219/121.68, 121.69, 121.85

[56] References Cited

U.S. PATENT DOCUMENTS

| | | | |
|---|---|---|---|
| 4,256,532 | 3/1981 | Magdo et al. | 156/628 |
| 4,417,946 | 11/1983 | Bohlen et al. | 156/643 |
| 4,419,182 | 12/1983 | Westerberg | 156/644 |
| 4,478,677 | 10/1984 | Chen et al. | 156/643 |
| 4,490,210 | 12/1984 | Chen et al. | 156/643 |
| 4,490,211 | 12/1984 | Chen et al. | 156/643 |
| 4,923,772 | 5/1990 | Krich et al. | 430/5 |

OTHER PUBLICATIONS

A. Tam, et al., "Mask for Excimer Laser Ablation and Method of Producing Same", IBM Technical Disclosure Bulletin, vol. 33, No. 1A Jun. 1990, pp. 388–390.

Primary Examiner—William A. Powell

[57] ABSTRACT

A mask for use with high energy radiation sources in precision projection processing by excimer lasers, for example, is described. The mask comprises a suitable substrate, such as silicon, upon which a multilayer dielectric stack is formed which acts as a reflective coating for the impinging excimer laser radiation, minimizing energy absorption by the mask substrate. The mask transparent areas are defined by the through-holes in the mask. The through-holes are formed with a conically undercut edge profile to define a thin object plane for the mask and minimize scattering of the radiation from the through-hole sidewalls. A method for fabricating the mask is also described.

39 Claims, 5 Drawing Sheets

UNDERCUT MEMBRANE MASK FOR HIGH ENERGY PHOTON PATTERNING

BACKGROUND OF THE INVENTION

The present invention relates generally to transmission masks of the type used for laser processing of surfaces, and, more particularly, to non-contact shadow masks utilized in laser ablation processes fabricated from a thick membrane utilizing conically undercut through holes to provide the desired ablation pattern and laser energy reflective coatings in the non-patterned areas.

In the field of microelectronic materials processing the use of high power lasers to provide selective etching or micromachining of substrate materials, metal films and layers of other materials, such as polyimide, is becoming increasingly important. Of key importance to this technology is a shadow mask or projection mask to project the pattern of the microstructures onto the material to be machined. It is well-known in the art to provide masks for ion etching, ion implantation and in optical, x-ray, ion and electron beam lithography. Masks of these types are used in relatively low power applications and typically are not suitable for high power laser applications, such as excimer laser ablation.

Prior art masks presently utilized in laser etching applications typically comprise a suitable substrate having clear or transparent areas and opaque areas to define the desired etch pattern to be projected. As increasingly higher power lasers are utilized and more exact and smaller element sizes are realized, a few micrometers (um) in size, for example, mask requirements such as reduction of defects in both the clear and opaque areas become critical.

The following criteria have been identified for ideal masks to provide optimal performance during high energy laser etching, micromachining, material deposition or other surface treatment of materials.

1. The mask object plane must be extremely thin to provide a well-defined image plane together with a full depth of focus at the image plane to provide, for example, the ability to etch deep structures in the surface of a material.

2. The mask object plane must be stable in all directions; that is, no bending or warpage of the mask object plane resulting from, for example, thermal expansion or mechanical stress or vibration of the mask.

3. The mask clear or transparent areas must be defect-free.

4. The mask opaque areas must be defect-free.

5. The mask must have a versatile alignment capability; for example, mask alignment targets should be detectable at the process laser wavelength and at a convenient alignment laser wavelength, a helium-neon laser, for example.

6. The mask should be compatible with a viable inspection scheme; that is, the mask pattern should be clearly detectable with visible radiation to allow for inspection utilizing an optical microscope, for example.

7. The mask materials, both the substrate and overlaying layers, must be stable under the high pulse rate, high power radiation typically encountered during excimer laser ablation or other high-power laser processes.

Prior art "chrome on glass" masks, shown in FIG. 1a, as used, for example, for optical lithography in IC-chip fabrication consist of a thin (several hundred Angstroms) layer of chrome defining an opaque pattern on an unstructured clear glass or quartz substrate. Typically, masks of these type will exhibit defects resulting from particulates in the transparent areas or microcracks in the substrate and pinholes in the opaque chrome layer.

U.S. Pat. Nos. 4,490,210; 4,490,211 and 4,478,677, issued to Chen et al, all assigned to the instant assignee, disclose laser etching of metalized substrates and glass materials involving an intermediate step in which the material to be etched forms a reaction product resulting from exposure to a selected gas, which is then vaporized by a beam of radiation of a suitable wavelength. Many materials can be etched directly by laser energy without the need for an intermediate step creating a reaction product material. The Chen et al patents describe non-contact masks as having a transparent substrate/body of UV grade quartz with a pattern chromium film thereon. It has been found, however, that such chromium masks cannot withstand laser energy densities of the order encountered when working with excimer or other lasers having the required intensity to etch or ablate many target materials directly. While satisfying several of the above-defined mask requirements, chromium may absorb as much as half of the incident laser energy at selected wavelengths. Thus, a single excimer laser pulse may easily ablate the chromium and destroy the opaque pattern.

U.S. Pat. No. 4,923,772 issued to Kirch et al, assigned to the instant assignee and incorporated by reference as if fully set forth herein, discloses a high-energy laser mask comprised of a transparent substrate having a patterned laser-reflective metal or dielectric coating deposited thereon. Typically referred to as a "dielectric mask", a mask, shown in FIG. 1b, comprising a transparent substrate/body having the opaque pattern formed of several layers of a highly reflective, abrasive-resistant dielectric coating provides a mask able to withstand the full range of laser intensities encountered in laser etching processes. For example, Kirch et al discloses a dielectric mask comprising many layers of such dielectric coatings deposited on a substrate of UV grade synthetic fused silica which achieves greater than 99.9% reflectivity of the incident laser energy. Such a dielectric patterned mask can withstand incident energy densities up to approximately 6J/cm$^2$. However, defects resulting from particulates in the substrate material or microcracks and pinholes in the dielectric layers may be present. As discussed by Kirch et al, relatively pure substrate material such as UV grade synthetic fused silica is required to avoid laser absorption by impurities or inclusions in the mask clear areas. However, long-term irradiation with high-power UV radiation may induce absorptions in the mask clear areas due to solarization effects. Additionally, since the dielectric materials typically reflect radiation only in a small spectral region, near the wavelength of the processing laser, it is typically transparent in the visible range, thus presenting difficulties for a conventional optical system alignment, or inspection, utilizing, for example, an optical microscope.

Thin metal sheets fabricated from materials such as molybdenum or steel, having physical through holes formed transversely through the metal sheet representing the transparent or clear areas, referred to as metal stencil masks, as shown in FIG. 1c, have also been widely used as excimer laser masks. However, at high energy densities and high pulse repetition rates, energy absorption results in excessive heating of the mask materials, resulting in distortions in the mask object plane and rapid deterioration of the mask. Additionally, since the metal stencil masks are relatively thick, on the order of 50 um or more, scattering of the laser beam from the vertical sidewalls of the through holes degrades beam focus and image quality.

U.S. Pat. No. 4,417,946, issued to Bohlen et al, assigned to the instant assignee, discloses a mask suitable for ion etching, ion implantation and x-ray, ion and electron beam lithography. Such a mask comprises one or more metal layers deposited on a highly doped semiconductor substrate with through going apertures defining the mask pattern. In the area of the mask pattern apertures, the substrate material is relatively thin, thus minimizing scattering effects of the incident beam. The highly doped substrate material provides mechanical stability. However, as discussed herein above, the metallic layers cannot withstand the high energy densities commonly encountered in excimer laser ablation processes.

In "Mask for Excimer Laser Ablation and Method of Producing Same," IBM Technical Disclosure Bulletin, Vol. 33 No. 1A June 1990, pp. 388-390, A.C. Tam et al considers a silicon thin membrane stencil mask having transparent areas realized by suitably dimensioned apertures through the membrane. The thermal stability of the mask is increased by coating the surface of the mask facing the laser source with a multilayer reflection system and/or coating the surface of the mask facing the material to be ablated with a metallic gold layer. However, in the high power, high repetition rate environment experienced during excimer laser ablation processes, thin membranes exhibit undesirable and intolerable bending and warping resulting from heating induced by the small amount of laser radiation transmitted through the multilayer reflection system and from mechanical stress induced in the membrane material by residual stress in the multilayer reflection system. Additionally, the silicon thin membrane mask exhibits a tendency to vibrate when exposed to high pulse repetition rates. The non-stable object plane resulting from the combined effects of mask bending and vibration significantly reduces the depth of focus and may cause scattering effects, distorting the transmitted pattern and resulting in poor image quality.

SUMMARY OF THE INVENTION

A primary objective of the present invention is to provide a transmission mask for use in laser processing of material surfaces, excimer laser ablation processes, for example, having sufficient mechanical stability to provide high precision, high quality imaging. The thin membrane stencil mask, described above, effectively satisfies all requirements for an ideal mask with the exception of mechanical and thermal stability of the object plane. Thermal stability of the thin membrane mask may be greatly improved by coating the mask surface exposed to high energy laser radiation with a multilayer dielectric coating. A suitable multilayer dielectric coating can achieve greater than 99% reflectivity of incident radiation thus providing a stencil mask suitable for many laser ablation processes. Warpage and vibration of the mask may be substantially eliminated and thus the mechanical stability of the object plane greatly improved by providing a thick membrane substrate to strengthen the mask and improve heat removal. However, transparent mask areas defined by apertures having vertical sidewalls through the thick membrane do not provide the thin object plane required, thus causing scattering effects of the incident radiation and distorting the transmitted pattern. A solution to the problem of providing a thin object plane while utilizing a thick membrane to provide a stable object plane, is achieved by conically undercutting the edges of the vertical through holes. In this manner, a thick membrane mask is achieved having sufficient mechanical rigidity to minimize warpage while providing a thin mask object plane in the vicinity of the through holes to achieve high quality imaging.

Accordingly, a transmission mask constructed in accordance with the principles of the present invention comprises a thick membrane having transmissive or transparent areas defined by conically undercut through holes and non-transmissive or opaque areas defined by a multilayer high reflective dielectric stack. The mask is fabricated from a suitable substrate material, such as crystalline silicon, heavily doped with a suitable dopant, boron, for example, to a depth of a few micrometers on selected areas of the mask substrate surfaces. Utilizing well-known techniques, a thick membrane, approximately 40 um thick, for example, having through holes with vertical sidewalls representing the mask transparent areas is formed. Utilizing the characteristics of anisotropic wet etching, the thick membrane is then etched from its back side to provide conically undercut profiles for the through hole walls representing the transparent areas of the mask, thus providing a relatively thick membrane of increased strength and mechanical rigidity, yet having a thin optical plane in the immediate areas surrounding the through holes. In a final step, the front or top side of the mask is coated with alternating layers of dielectric materials having different indices of refraction. Each pair of dielectric layers will reflect a given amount of incident radiation; by depositing many pairs of layers, greater than 99% reflectivity of incident radiation can be achieved.

Mechanical stress to the substrate membrane induced by the dielectric stack is effectively compensated for by high tensile stress induced in the membrane by heavy doping. Additionally, the high tensile stress induced by the heavy doping provides "pseudocooling" of the mask membrane, minimizing warpage and increasing the rigidity of the mask membrane even for significant temperature differentials, 70° C., for example, between the mask membrane and the mask frame. Excessive differential mask temperatures are minimized by the high reflectivity of the dielectric coating stack and the effective heat removal by the thick membrane surrounding the thin object plane areas. Thus, the disclosed conical undercut dielectric stencil mask of the present invention provides a thick membrane of sufficient strength and mechanical rigidity to minimize warpage and high vibrational amplitudes while at the same time providing the desired thin object plane for high quality imaging.

DETAILED DESCRIPTION OF PREFERRED EMBODIMENTS

Figure 1A:
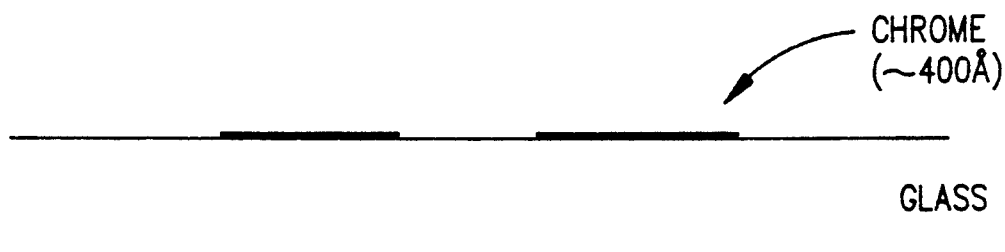
FIGS. 1a-1c are diagrammatic cross-sectional views illustrating various prior art mask structures.
Figure 1B:
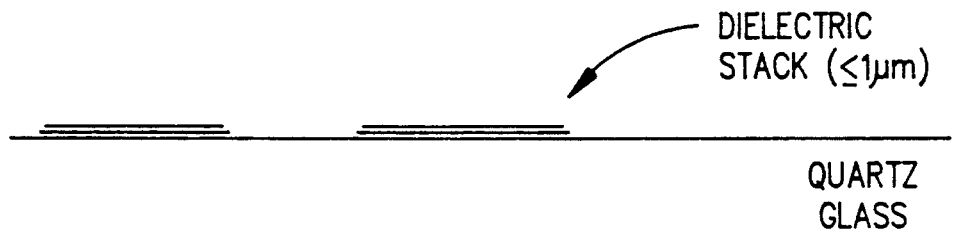
Figure 1C:
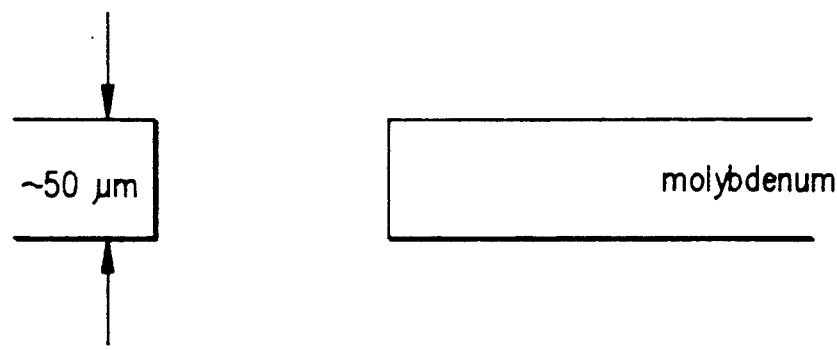
Figure 2:
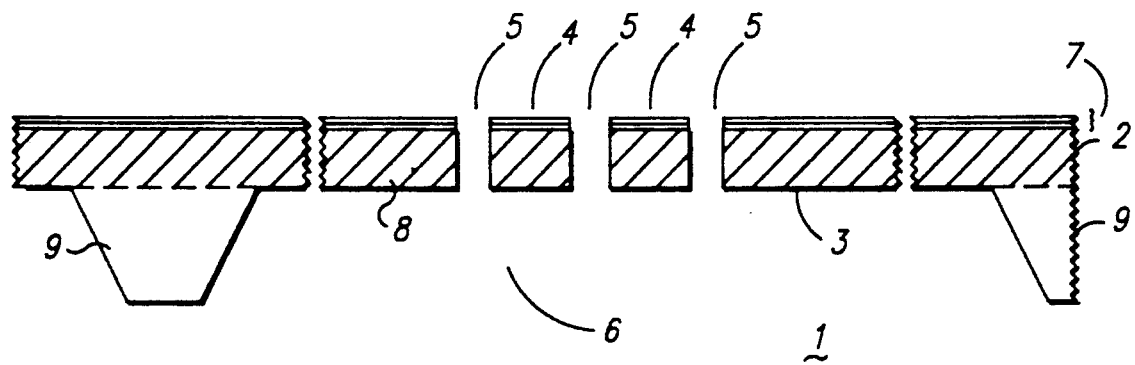
FIG. 2 is a diagrammatic cross-sectional view of a portion of the thin membrane mask in accordance with the principles of the present invention.

Referring now to FIG. 2, a portion of a thin membrane stencil mask 1 constructed in accordance with the principles of the present invention is shown. The mask 1, fabricated from a substrate of suitable material, preferably a crystalline wafer such as crystalline silicon, comprises a relatively thick substrate 2 having one or more tub-shaped recesses 6 formed in the bottom or back side thereof to provide relatively thin areas of the wafer forming thin membranes 3 having lateral dimensions corresponding to the relative size of the structure or circuit to be fabricated utilizing such a mask or series of masks 1. The remaining thicker portions 9 of substrate 2 defining the edges of the substrate or ribs separating the mask areas on the substrate form mask frame members to support the thin membrane 3. The desired mask pattern is defined by a series of apertures or holes 5 having vertical sidewalls and extending through the thin membrane 3. The top or front side of the mask is coated with multiple layers 7 of pairs of dielectric materials to provide a highly reflective surface defining the opaque areas 4 of the mask pattern.

As described in greater detail below, in one preferred embodiment, the mask 10 is fabricated from a crystalline silicon wafer utilizing well-known photolithographic etching techniques. In a first step, the top side of the silicon wafer 2 is doped with a suitable 5 dopant to a depth of 2-3 um forming a heavily-doped layer 8 which acts as an etch stop defining the thickness of the thin membrane 3 and inducing a high tensile stress in the thin membrane 3 to compensate for any mechanical stress induced by the dielectric coating 7. Recesses 6 are formed utilizing an anisotropic etching technique to wet etch the back side of silicon wafer 2. Wet etching of the silicon wafer is terminated at the boundary of the doped layer 8 to form thin membrane 3 having a thickness of approximately 2-3 um. Utilizing a silicon dioxide mask layer (not shown) with an anisotropic dry etch process, the silicon thin membrane 3 is etched from the front side to form apertures 5 extending through the thin membrane into recess 6. In a final sequence, the front side of thin membrane 3 is coated with multiple layers of pairs of dielectric materials to form a reflective coating having a thickness of 1-2 um covering the remaining surface area of the thin membrane 3 thus defining the opaque areas 4 of the desired mask pattern.

The described membrane stencil mask provides a high resolution laser etch mask having a rigid object plane approximately 3-5 um thick. The highly reflective dielectric coating minimizes absorption of incident laser radiation by the thin membrane thus minimizing heating of the thin membrane. However, in high power, high repetition rate environments, even the small proportion of radiation incident on the mask surface transmitted by the dielectric coating is sufficient to produce undesirable heating of the thin membrane. In addition, the silicon thin membrane exhibits a tendency to vibrate when exposed to high pulse repetition rates.

As noted above, while a thin membrane stencil mask having a patterned dielectric mask provides excellent thermal and mechanical characteristics suitable for many applications, in high power, high repetition rate environments both thermal and mechanical properties deteriorate. In the alternative, a preferred mask suitable for use in high power, high repetition rate environments comprises a thick membrane wherein the desired mask pattern is defined by a plurality of apertures extending through the thick membrane and having conical undercut sidewalls providing the optical characteristics of a thin membrane in the mask areas immediately adjacent the apertures together with the thermal and mechanical of a thick membrane.

Figure 3:
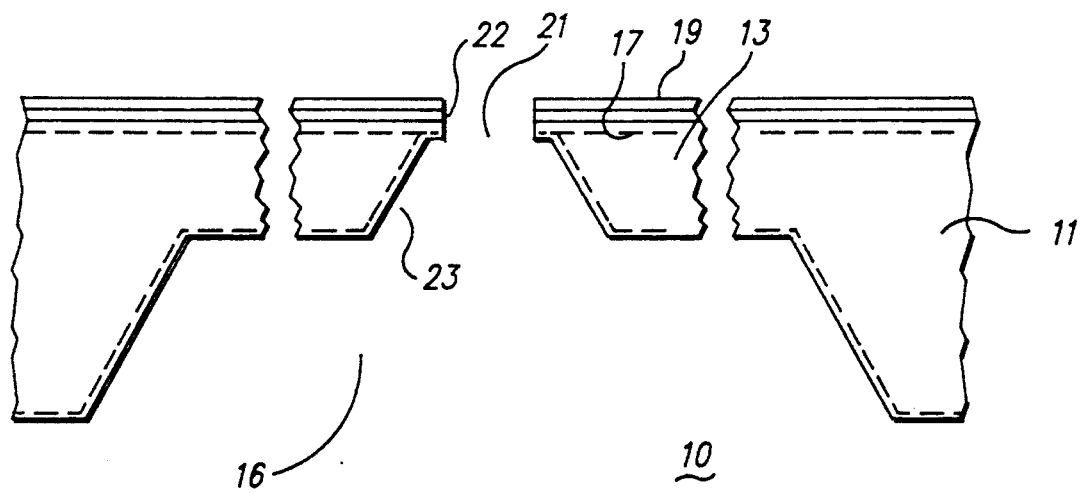
FIG. 3 is a diagrammatic cross-sectional view of a portion of the thin membrane conical undercut mask in accordance with the principles of the present invention.

Referring now to FIG. 3, a portion of a thick membrane conical undercut stencil mask 10 constructed in accordance with the principles of the present invention is shown. The mask 10, fabricated from a substrate of suitable material, preferably a crystalline wafer such as crystalline silicon, comprises a relatively thick substrate 11 having one or more tub-shaped recesses 16 formed in the bottom or back side thereof to provide relatively thin portions of silicon forming thick membranes 13 having lateral dimensions corresponding to the relative size of the structure or chip to be fabricated utilizing such a mask or series of masks 10. The thicker portions 15 of substrate 11 form mask frame members to support the thick membrane portions 13. The thick membrane 13 has a thickness preferably of the order from 35–40 um, while the thickness of the thicker supporting mask frame 15 can be of the order from 200–1,000 um. A plurality of apertures 21 extending transversely through thick membrane 13 define the lateral geometry of the desired etch pattern to be produced utilizing the mask 10. The apertures 21 are formed in thick membrane 13 having vertical sidewalls 22 extending a short distance through the thick membrane to intersect with conical sidewalls 23 extending the remaining distance through the thick membrane 13. Conical sidewalls 23 allow a thick membrane mask to be utilized while providing a thin optical plane defined by vertical sidewalls 22. The top or front side of the mask 10 is coated with multiple layers of dielectric materials to provide a highly reflective surface defining the opaque areas 19 of the etch pattern. The dielectric coating 19 can provide greater than 99% reflection of incident radiation. The vertical sidewall 22, including the thickness of the dielectric coating 19, extends into thick membrane 13 a distance, preferably 3–4 um, within the depth of focus for the radiation wavelength in use. A highly doped layer 17 formed in the surface of the substrate 11 induces a high tensile stress in the thick membrane 13 to provide pseudo-cooling and to compensate for any mechanical stress induced by the dielectric coating 19 and to act as an etch stop defining vertical wall 22. While suitable for many types of operations, the thick membrane stencil mask of the present invention is preferably used in projection systems for excimer laser ablation processes.

Referring now to FIGS. 4a–4g, a preferred method for fabricating the stencil mask according to the present invention will be described. Various steps utilized in the fabrication method of stencil mask 10 will not be described in extensive detail as they are well known in the photolithographic masking art. Alternative methods readily adaptable for fabrication of the instant stencil mask are provided in detail from U.S. Pat. No. 4,256,532, assigned to the instant assignee and the afore-referenced U.S. Pat. No. 4,417,946.

Figure 4A:
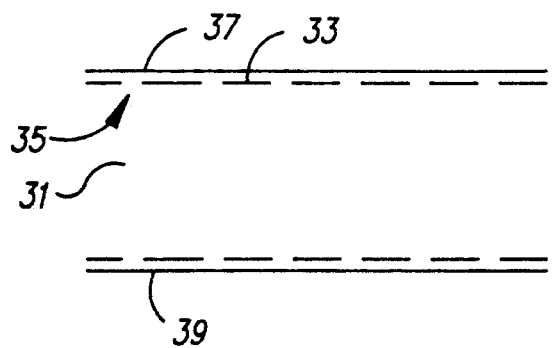
FIGS. 4a–4h are diagrammatic cross-sectional views of a portion of the mask structure during fabrication in accordance with the preferred embodiment of the present invention.

As shown in FIG. 4a, an initial silicon wafer 31 cut in the (100) crystallographic plane having a thickness of 200–1,000 um is heavily boron doped to a depth of approximately 1–3 um at both the front and back sides 37, 39, respectively. The boron doping is by well-known methods, such as blanket boron capsule diffusion to provide a doping level of for example $1 \times 10^{20}$ atoms per cm$^3$ at the interface 35. The wafer front and back sides 37 and 39, respectively, typically are highly polished.

Figure 4B:
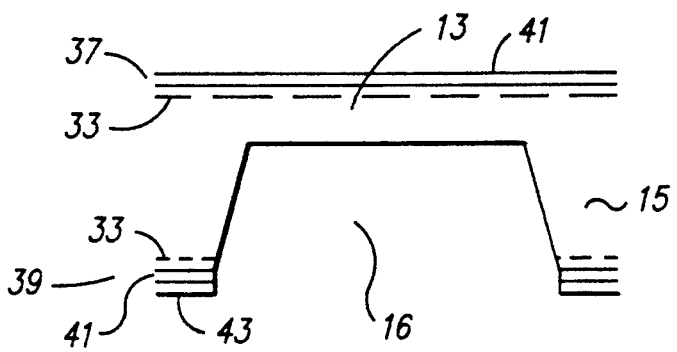

Next, shown in FIG. 4b, a layer of silicon dioxide 41, approximately 2 um in thickness is formed over both the front and back sides, 37, 39, respectively, of the silicon wafer 31. The silicon dioxide layer 41 is preferably deposited by a non-thermal growth technique such as conventional sputter deposition or chemical vapor deposition to minimize distortion and stress induced in the silicon wafer 31. Next, the layer of silicon dioxide coating the back side 39 of the wafer is coated with photoresist. Utilizing conventional photolithographic etching techniques, the photoresist layer 43 is developed and wet etch of the silicon dioxide layer 41 utilizing a single-side etch tool is accomplished to form a mask on the back side 39 of the substrate 31. Apertures in the silicon dioxide mask thus formed serve to define the pattern of tub-shaped recesses 16, which are to be formed in the back side of the substrate 31.

Recesses 16 are formed in substrate 31 utilizing an anisotropic etching technique to wet etch the back side of the silicon wafer. Wet etching of the silicon wafer is terminated at, for example, approximately 40 um from the front surface 39 of the silicon wafer to form the thick membrane 13 and mask frame sections 15. The anisotropic etching minimizes undesirable lateral etching of the silicon while the recesses 16 are formed.

Figure 4C:
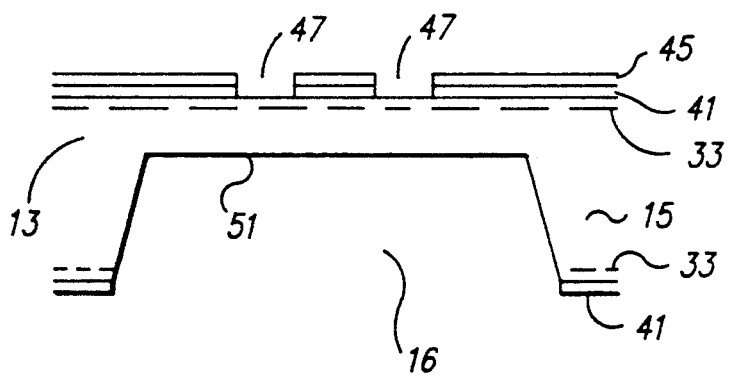
Figure 4D:
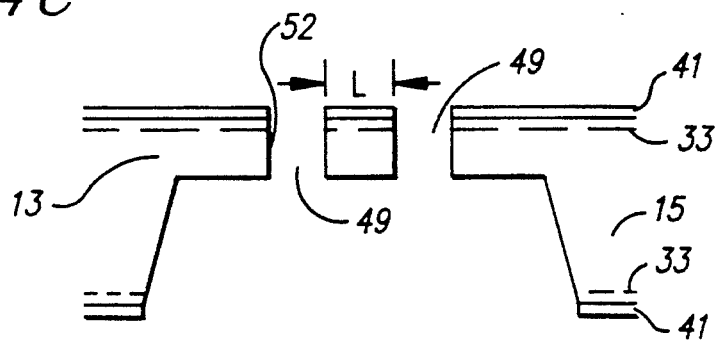

As shown in FIGS. 4c and 4d, the silicon dioxide layer 41 over the front side 37 of the silicon wafer is coated with a photoresist layer 45. In a similar manner, as described above, the photoresist layer 45 is developed and the silicon dioxide layer 41 is wet etched in a single-side etch tool to form a mask in silicon dioxide layer 41. The apertures 47 in the silicon dioxide mask serve to define the desired mask pattern to be formed in thick membrane 13. Utilizing anisotropic dry etch techniques, such as reactive ion etching (RIE), the silicon is etched from the front side 37 to form apertures 49 extending through thick membrane 13 into recess 16 at the pattern areas 47. The RIE dry etch process results in through-holes 49 having vertical sidewall profiles.

Figure 4E:
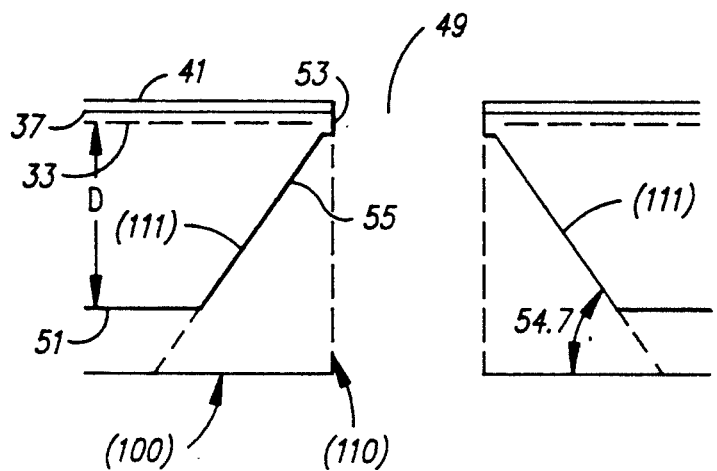
Figure 4F:
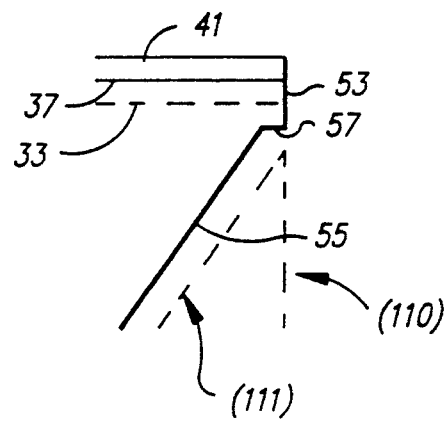
Figure 4G:
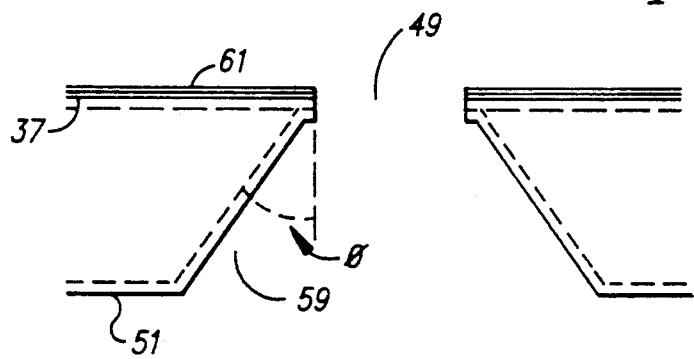

As shown in FIGS. 4e, 4f and 4g, anisotropic wet etch techniques are then utilized to form a conically undercut sidewall profile for through-holes 49. The anisotropic characteristics of crystalline silicon provide etch rates (ER) normal to the various indicated crystalline planes, for example, in 10-molar KOH solution at 62° C., of $$ER(110) = 2 \times ER(100) = 120 \times ER(111)$$

with ER(110) being approximately 0.6 um per minute. When immersed in the etch solution, the vertical wall 52 (as shown in FIG. 4d), the (110) plane, will etch fastest whereas the thick membrane back plane 51, the (100) plane, will etch only half as fast, thus preventing substantial additional thinning of the thick membrane 13. The etch rates of the (110) and (100) planes, in combination with the essentially zero etch rate of the (111) plane, provide for the formation of the desired conical sidewall 55 parallel to the (111) plane. Wet etching from the silicon wafer front surface 37 is prevented by the silicon dioxide layer 41. Since the heavily doped silicon is not etched by the wet etch solution, the through-hole 49 retains a vertical lip 53 at the front surface 37 of the thick membrane, thus preserving the desired mask pattern as defined during the lithographic and RIE process steps described hereinabove. The heavily doped front surface 37 represents the mask object plane and has a thickness approximately equal to the depth to the boron doping in the silicon substrate.

The lateral underetch or undercut resulting from the very slow etching of the diagonal or (111) plane results in a relatively small undercut distance 57 to provide a thin object plane and the desired conical undercut etch profile for each through-hole 49. As shown in FIG. 4g, the anisotropic wet etch process produces an underetch pattern determined by the orientation of the (111) planes. In particular, for crystalline silicon a generally rectangular underetch pattern results about the mask apertures, including circular apertures. In this example, the undercut 57 is approximately 0.4 um. For mask pattern structures having a horizontal distance L between adjacent through-holes 49, where $L < 2 \times D \times TAN(\phi)$, where D is the thickness of thick membrane 13 and $\phi$ is the angle of conical sidewall 55 from the vertical, the thickness of the membrane separating adjacent through-holes will be less than D. Such local variations in membrane thickness typically do not impose a problem since their relative area is extremely small. The silicon substrate 13 will etch such that the conical wall 55 will form an angle $\phi$ of 35.26° with the vertical when the silicon has a (100) crystallographic orientation.

Figure 4H:
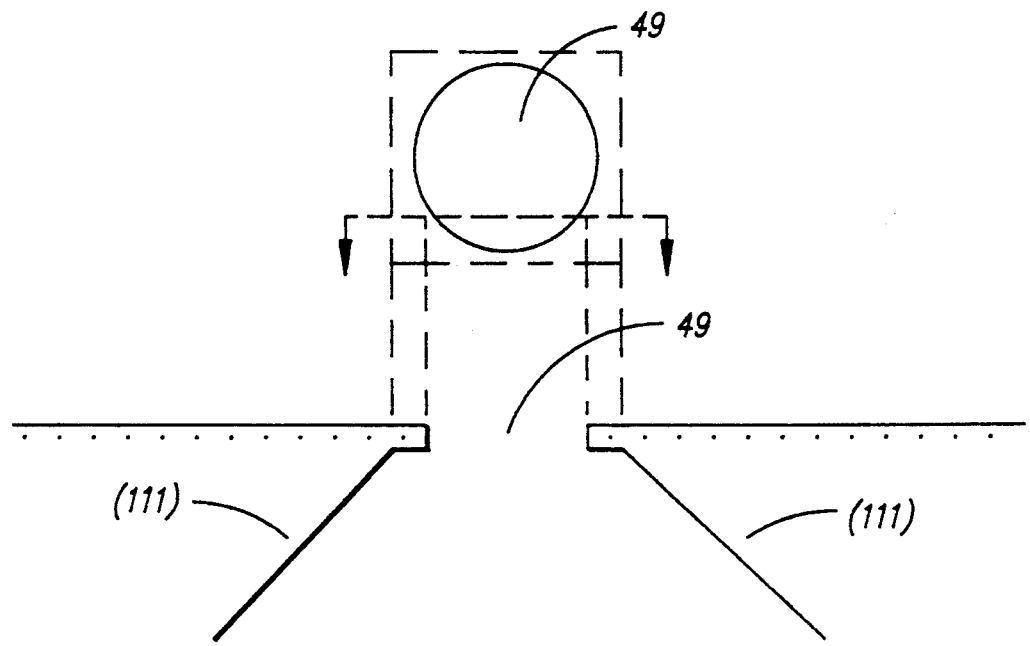

In a final sequence, as shown in FIG. 4h, the back side 51 of the thick membrane 13 including the conical walls 55 are boron doped to the same concentration as the front surface 37 to provide symmetric doping on both the front and back sides of the thick membrane 13. The silicon dioxide layers 41 are then stripped from the front and back sides 37, 39 in a conventional manner and the front side 37 of the thick membrane 13 is coated with a dielectric stack 61 to form a reflective coating covering the surface area of the thick membrane 13 thus defining the opaque areas of the mask pattern.

The dielectric stack 61 is a highly reflective, abrasion-resistant dielectric coating formed of adjacent layers of materials having different indices of refraction. If the index of refraction of a quarter wavelength of film is higher than that of the underlying layer, a substantial amount of light incident on these layers will be reflected. Thus, each pair of dielectric layers will reflect a given amount of incident radiation. Thus, by depositing many layers, a desired reflectivity may be obtained. The number of layers deposited is dependent on the intended usage. For example, a dielectric stack of alternating layers of silicon dioxide and hafnium oxide of approximately 20 layers having a total thickness on the order of 2 um provides greater than 99% reflectivity of incident radiation at a wavelength of 248 nm. High index materials may be hafnium oxide, scandium oxide, aluminum oxide or thallium fluoride. Low index materials may be silicon dioxide, and magnesium fluoride. These materials are cited as examples and the lists are not intended to be exhaustive.

Figure 5:
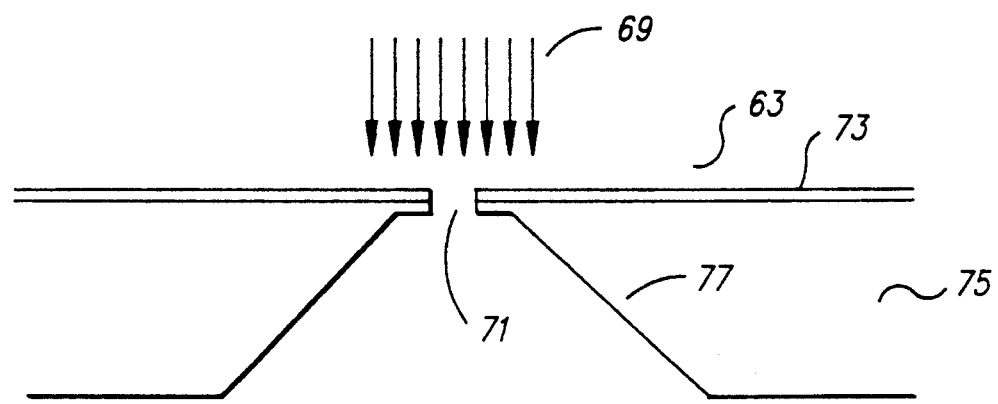
FIG. 5 is a diagrammatic cross-sectional view of the mask shown in FIG. 2 utilized in a projection system.
Figure 5:
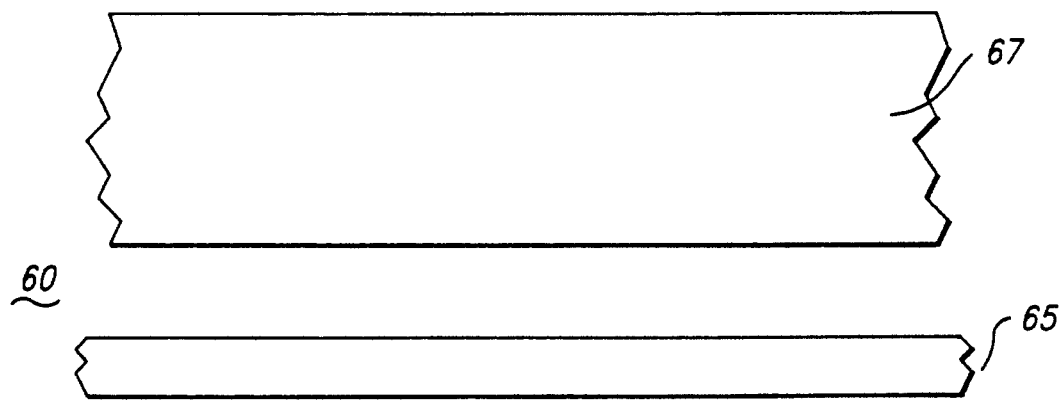

Referring now to FIG. 5, a conically undercut stencil mask 63, as described above, is shown utilized in a projection system for direct etching of the surface of a substrate 65. Incident radiation 69 is able to pass through aperture 71 to lens system 67 and is thereby imaged on the surface of the substrate 65 in the desired pattern defined by the apertures 71. Radiation 69 incident on the mask opaque areas 73 is reflected by the dielectric stack coating to minimize energy absorption and consequent heating of the thick membrane 75. The undercut etch profile of aperture 71 effectively provides a thin object plane in the vicinity of aperture 71 while the angled, conical sidewalls 77 minimize scattering of radiation transmitted through aperture 71.

Dielectric coated masks are capable of withstanding incident energy densities of the order of $6J/cm^2$ thus providing ideal masks for laser projection purposes. In such a laser projection system, the mask of the present invention may provide structures having dimensions as small as 1 um or less. For example, in a five-to-one reduction projection system, an aperture 71 of 5 um at its greatest dimension produces a structure in the surface of substrate 65 of 1 um at its greatest dimension. Being durable and largely impervious to chemical damage, dielectric coated masks can be utilized for other applications such as deposition and etching induced by laser irradiation. Furthermore, the composition and arrangement of the dielectric layers may be chosen to provide a desired level of reflectivity and chemical stability for the intended purposes.

Although the present invention has been described in its preferred form with a certain degree of particularity, it is understood that the present disclosure of the preferred embodiments has been by way of example and that the teachings of the invention are not limited to the particular materials or processing steps described, but that numerous changes in the details of construction and the combination and arrangements of elements may be resorted to without departing from the spirit and scope of the invention as hereinafter claimed.

We claim:

1. A mask for use with high energy radiation sources comprising:
    a substrate;
    at least one dielectric layer formed on a first surface of said substrate to produce a layered structure having a thickness of a first dimension; and
    at least one aperture in said layered structure, said aperture extending through said substrate, said aperture having a generally conically undercut edge profile with substantially vertical sidewalls of a second dimension adjacent to said first surface, said second dimension being substantially less than said first dimension for providing a thin object plane for said mask.

2. A mask as in claim 1 wherein said vertical sidewalls extend through said dielectric layer and said first surface to a first predetermined depth in said substrate.

3. A mask as in claim 2 wherein said substrate includes a doped layer at said first surface, said doped layer having a higher concentration of dopant impurities to said first predetermined depth in said substrate than the substrate beneath said doped layer.

4. A mask as in claim 3 wherein said second dimension is in the range of approximately between 3 and 4 micrometers.

5. A mask as in claim 1 having at least one tub-shaped recess formed in a second side of said substrate opposite said first surface for forming a membrane of said substrate material in the area of said recess, a plurality of said apertures forming a desired pattern extending through said membrane into said recess, each said aperture having said generally conically undercut edge profile, said membrane having a predetermined thickness, said second dimension being substantially less than said predetermined thickness.

6. A mask as in claim 5 wherein said substrate includes a doped layer at said first surface, said doped layer having a higher concentration of dopant impurities than the substrate beneath said doped layer, said dielectric layer overlying said doped layer.

7. A mask as in claim 6 wherein each said aperture conically undercut edge profile comprises said vertical side walls of said second dimension extending through said dielectric layer and said doped layer, said doped layer being undercut a predetermined amount forming a thin lip for said aperture at said first surface and generally outwardly sloping sidewalls extending from said undercut doped layer to said recess.

8. A mask as in claim 7 wherein said predetermined thickness of said membrane is in the range of approximately between 35 and 40 micrometers and said second dimension is in the range of approximately between 3 and 4 micrometers.

9. A mask as in claim 7 wherein said substrate material comprises a crystalline silicon wafer having a (100) crystallographic orientation.

10. A mask as in claim 9 wherein the plane of said sloping sidewalls parallels the (111) crystallographic plane of said silicon substrate.

11. A mask as in claim 9 wherein said dopant impurity comprises boron.

12. A mask as in claim 1 wherein said substrate comprises a crystalline semiconductor wafer.

13. A mask as in claim 1 wherein said dielectric layer comprises a pair of dielectric materials, said layer comprising a coating of a first material and a coating of a second material overlying said first material, the index of refraction of said second material being higher than the index of refraction of said first material.

14. A mask as in claim 13 wherein said dielectric layer comprises a plurality of pairs of said dielectric materials.

15. A mask as in claim 13 wherein said first material is selected from the group consisting of silicon dioxide and magnesium fluoride, and said second material is selected from the group consisting of hafnium oxide, scandium oxide, aluminum oxide and thallium fluoride.

16. A method for fabricating a mask for use with high energy radiation sources comprising the steps of:
    forming at a first surface of a planar substrate a doped layer, said doped layer having a higher concentration of dopant impurities to a first predetermined depth than the substrate beneath said doped layer;
    forming a first masking layer on said first surface and a second masking layer on a second surface opposite said first surface of said substrate, said first masking layer defining a desired mask pattern;
    forming at least one aperture through said second masking layer exposing selected portions of said second surface and etching said selected portions to form at least one recess in said substrate to a second predetermined depth, the substrate material remaining between said recess and said first surface forming a membrane;
    etching said membrane through said first masking layer to form a plurality of apertures in said desired mask pattern, said apertures extending through said membrane into said recess;
    anisotropic etching said membrane undercutting said heavily doped layer and forming outwardly sloping aperture sidewalls extending from said undercut layer to said recess defining a generally conical undercut edge profile for said apertures through said membrane;

removing said first and second masking layers; and applying at least one dielectric layer to said first surface.

17. The method of claim 16 wherein the step of forming a doped layer at said first surface includes the step of forming a doped layer at said second surface of said substrate.

18. The method of claim 16 wherein said substrate comprises crystalline silicon.

19. The method of claim 18 wherein said dopant material comprises boron.

20. The method of claim 17 including the additional step of forming a doped layer on the surfaces defining said recess at the completion of said anisotropic etching step.

21. The method of claim 16 wherein each said masking layer comprises a layer of silicon dioxide.

22. The method of claim 21 wherein said step of forming each masking layer of silicon dioxide comprises depositing a layer of silicon dioxide by chemical vapor deposition.

23. The method of claim 18 wherein the step of etching said membrane through said first masking layer comprises anisotropic reactive ion etching to form said plurality of apertures, said apertures having vertical side walls.

24. The method of claim 18 wherein the step of anisotropic etching of said membrane comprises anisotropic wet etching in an alkaline solution.

25. The method of claim 24 wherein said alkaline solution comprises a 10-molar solution of potassium hydroxide.

26. The method of claim 24 wherein the plane of said sloping aperture sidewalls is parallel to the (111) crystallographic plane of said silicon substrate.

27. A method as in claim 16 wherein said dielectric layer comprises a pair of dielectric materials, said layer comprising a coating of a first material and a coating of a second material overlying said first material, the index of refraction of said second material being higher than the index of refraction of said first material.

28. A method as in claim 27 wherein said dielectric layer comprises a plurality of layers of said pairs of dielectric materials.

29. A method as in claim 27 wherein said first material is selected from the group consisting of silicon dioxide and magnesium fluoride, and said second material is selected from the group consisting of hafnium oxide, scandium oxide, aluminum oxide and thallium fluoride.

30. A method of laser processing a target substrate comprising the steps of:

generating a high energy radiation beam;

locating a transmission mask defining a desired processing pattern in front of said target substrate, said high energy radiation beam incident on said transmission mask, said mask comprising:

a substrate;

at least one dielectric layer formed on a first surface of said substrate to produce a layered structure having a thickness of a first dimension, said high energy radiation beam incident on said dielectric layer; and at least one aperture in said layered structure, said aperture extending through said substrate and said dielectric layer, said aperture having a generally conically undercut edge profile with substantially vertical sidewalls of a second dimension adjacent to said first surface said second dimension being substantially less than said first dimension; and imaging the radiation transmitted through said mask exiting said undercut aperture onto said target substrate.

31. A mask for use in laser processing of target materials comprising:

a substrate;

a reflective coating including at least one layer of dielectric material having a high reflectivity formed on a top surface of said substrate to produce a layered structure having a predetermined thickness; and at least one aperture in said layered structure, said aperture extending through said layered structure.

32. A mask for use in laser processing of target materials comprising:

a substrate;

at least one dielectric layer formed on a top surface of said substrate to produce a layered structure having a predetermined thickness; and at least one tub-shaped recess formed in a bottom surface of said substrate opposite said top surface for forming a membrane of said layered structure in the area of said recess, said membrane being of said predetermined thickness, a plurality of apertures formed in said membrane defining a desired pattern therein and extending through said membrane into said recess, each aperture having generally vertical sidewalls.

33. A mask as in claim 32 wherein said substrate includes a doped layer at said top surface, said doped layer having a higher concentration of dopant impurities than the substrate beneath said doped layer, said dielectric layer overlying said doped layer.

34. A mask as in claim 33 wherein said membrane includes said doped layer.

35. A mask as in claim 34 wherein said membrane has a thickness in the range of approximately between 3 and 4 micrometers.

36. A mask as in claim 32 wherein said dielectric layer comprises a pair of dielectric materials, said layer comprising a coating of a first material formed on said top surface and a coating of a second material overlying said first material, the index of refraction of said second material being higher than the index of refraction of said first material.

37. A mask as in claim 36 wherein said dielectric layer comprises a plurality of pairs of said dielectric materials.

38. A mask as in claim 31 wherein said layer of dielectric material comprises a pair of layers of dielectric material, said pair of layers comprising a layer of a first dielectric material and a layer of a second dielectric material, said layer of second dielectric material overlying said layer of first dielectric material, the index of refraction of said second dielectric material being higher than the index of refraction of said first dielectric material.

39. A mask as in claim 38 wherein said reflective coating comprises a plurality of pairs of said layers of first and second dielectric materials.

* * * * *

UNITED STATES PATENT AND TRADEMARK OFFICE
CERTIFICATE OF CORRECTION

PATENT NO. : 5,326,426
DATED : July 5, 1994
INVENTOR(S) : A. C. Tam et al.

It is certified that error appears in the above-indentified patent and that said Letters Patent is hereby corrected as shown below:

[73] On the Title page, under "Inventors", insert --
Assignee: International Business Machines Corporation, Armonk, New York -- and under "Primary Examiner", insert
-- Attorney, Agent or Firm - Leslie G. Murray --.

Signed and Sealed this

Eleventh Day of April, 1995

Attest:

BRUCE LEHMAN

Attesting Officer

Commissioner of Patents and Trademarks